US009018046B2

(12) United States Patent
Jwalant et al.

(10) Patent No.: US 9,018,046 B2
(45) Date of Patent: Apr. 28, 2015

(54) AREA-EFFICIENT DISTRIBUTED DEVICE STRUCTURE FOR INTEGRATED VOLTAGE REGULATORS

(71) Applicants: STMicroelectronics International N.V., Amsterdamn (NL); STMicroelectronics S.r.l, Agrate Brianza (IT)

(72) Inventors: Joshipura Jwalant, Noida (IN); Nitin Bansal, Gurgaon (IN); Amit Katyal, Ghaziabad (IN); Massimiliano Picca, Muggio (IT)

(73) Assignees: STMicroelectronics International N.V., Amsterdam (NL); STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 13/841,099

(22) Filed: Mar. 15, 2013

(65) Prior Publication Data

US 2013/0205587 A1   Aug. 15, 2013

Related U.S. Application Data

(62) Division of application No. 13/071,110, filed on Mar. 24, 2011, now Pat. No. 8,426,924, which is a division of application No. 11/325,236, filed on Jan. 3, 2006, now Pat. No. 7,939,856.

(30) Foreign Application Priority Data

Dec. 31, 2004   (IN) .......................... 2613/DEL/2004

(51) Int. Cl.
*H01L 21/82* (2006.01)
*H05K 3/30* (2006.01)
*G06F 17/50* (2006.01)

(52) U.S. Cl.
CPC .............. *H05K 3/30* (2013.01); *G06F 17/5063* (2013.01)

(58) Field of Classification Search
CPC ............ H01L 2021/70; H01L 2027/02; H01L 2924/14; H01L 2924/27; H05K 3/30; G06F 17/5063
USPC ......... 257/202, 204, 206, 207, 299, 355, 499, 257/734, 732, E27.001, E27.013, E29.001; 438/128, 129, 400, 587, 598, 499; 716/100, 118–120, 126, 132
See application file for complete search history.

(56) References Cited

U.S. PATENT DOCUMENTS

| 4,751,463 | A |   | 6/1988 | Higgs et al. |
| 5,010,292 | A |   | 4/1991 | Lyle, Jr. |
| 5,401,989 | A | * | 3/1995 | Kikuchi ......................... 257/211 |
| 5,945,696 | A | * | 8/1999 | Lin et al. ....................... 257/203 |
| 5,986,961 | A |   | 11/1999 | Igarashi |
| 6,339,234 | B1 | * | 1/2002 | Takizawa ....................... 257/203 |
| 6,562,638 | B1 |   | 5/2003 | Balasinski et al. |
| 6,594,809 | B2 |   | 7/2003 | Wang et al. |

(Continued)

*Primary Examiner* — Galina Yushina
(74) *Attorney, Agent, or Firm* — Gardere Wynne Sewell LLP

(57) ABSTRACT

An area efficient distributed device for integrated voltage regulators comprising at least one filler cell coupled between a pair of PADS on I/O rail of a chip and at least one additional filler cell having small size portion of said device is coupled to said I/O rails for distributing portions of said device on the periphery of said chip. The device is coupled as small size portion on the lower portion of said second filler cell for distributing said device on the periphery of said chip and providing maximal area utilization.

13 Claims, 4 Drawing Sheets

(56) References Cited

U.S. PATENT DOCUMENTS

| | | |
|---|---|---|
| 6,618,847 B1 * | 9/2003 | Hulse et al. .................... 716/115 |
| 6,674,646 B1 * | 1/2004 | Golshan et al. ............... 361/760 |
| 6,754,837 B1 | 6/2004 | Helms |
| 6,836,026 B1 * | 12/2004 | Ali et al. ........................ 257/786 |
| 6,903,389 B1 * | 6/2005 | Tai et al. ....................... 257/202 |
| 7,165,232 B2 | 1/2007 | Chen et al. |
| 7,194,707 B2 | 3/2007 | Chung-Maloney et al. |
| 7,444,609 B2 | 10/2008 | Charlebois et al. |
| 7,589,584 B1 * | 9/2009 | Bui ................................ 327/538 |
| 7,939,856 B2 | 5/2011 | Jwalant |
| 8,426,924 B2 | 4/2013 | Jwalant et al. |
| 2002/0066067 A1 | 5/2002 | Wang et al. |
| 2002/0080675 A1 | 6/2002 | Fuerle |
| 2003/0076640 A1 | 4/2003 | Malherbe et al. |
| 2003/0128608 A1 | 7/2003 | Song et al. |
| 2003/0172363 A1 | 9/2003 | Chauhan et al. |
| 2004/0041268 A1 | 3/2004 | Montagnana |
| 2004/0133868 A1 | 7/2004 | Ichimiya |
| 2004/0159894 A1 * | 8/2004 | Blisson et al. ................ 257/379 |
| 2004/0230769 A1 | 11/2004 | Kawashima et al. |
| 2005/0091629 A1 | 4/2005 | Eisenstadt et al. |
| 2005/0269705 A1 * | 12/2005 | Chen ............................ 257/758 |
| 2006/0190894 A1 | 8/2006 | Jwalant |

* cited by examiner

AREA-EFFICIENT DISTRIBUTED DEVICE STRUCTURE FOR INTEGRATED VOLTAGE REGULATORS

PRIORITY CLAIM

This application is a divisional of U.S. application Ser. No. 13/071,110 filed on Mar. 24, 2011, which application is a divisional of U.S. application Ser. No. 11/325,236, filed on Jan. 3, 2006, which application claims priority from Indian patent application No. 2613Del/2004, filed Dec. 31, 2004. All of the foregoing applications are incorporated herein by reference in their entireties.

TECHNICAL FIELD

The disclosure in general relates to an area-efficient distributed device structure for integrated voltage regulators, and in particular relates to an area-efficient distribution of a large-size device for integrated voltage regulators.

BACKGROUND

In a VLSI chip, both the core and the I/O blocks play an important role. The I/O blocks are arranged in the periphery in a ring-like fashion. To handle various signals like the power signals (high-voltage and low-voltage supplies and grounds), ESD signals, slew control signals, there are various rails passing above all the I/O blocks. However, these I/O blocks are spaced apart by a certain distance, the minimum of which is known as the pitch of the technology used. To ensure the continuity of these rails, some filler cells known as the IO-FILLERS are generally used. These filler cells contain nothing more than metal rails and ensure the continuity of rails in a non-stop ring-like fashion. The rails are generally in the top metal layers. However, the area occupied by these filler cells is not used for the fabrication of any transistor. Thus, the area of the metal rails is underutilized.

A concept of a voltage regulator is such that it contains a driver MOS (also called a pass transistor), whose size depends upon the load-current capability of the voltage regulator and is generally huge to provide current to the entire chip. This MOS needs an input supply VIN and generates an output supply VOUT, controlled by a voltage VCONT generated by a feedback circuit and an error amplifier as illustrated in FIG. 1. The output supply generated needs to be distributed in the entire chip. It is often not feasible to route the output supply to each and every corner of the chip, thus it is preferable to make use of the I/O ring in the periphery of the chip. This I/O ring will automatically route the supply VOUT around the periphery of chip. This is implemented by placing this driver MOS on the periphery of the chip so that it takes the input supply from one rail of the I/O ring and drives the output supply on another rail of the I/O ring, with the controlling voltage VCONT on a third rail.

The rails for VIN, the higher input supply, and VOUT, the lower output supply, are always present in an I/O ring with their corresponding grounds. In addition to these rails, there are certain dedicated rails in an I/O ring to take an external reference signal round the chip. One of these rails can be used to take the VCONT signal round the periphery of the chip to connect the gates of all the pass transistors together. In this way all the three nodes coupled to the pass transistor are taken round the I/O ring with great ease.

Conventional voltage regulators have a bypass mode, where VIN is to be bypassed to the output node VOUT by pulling down the VCONT node to ground, and VIN applied is at the level of the VOUT itself. For example, in the bypass mode of a 5V to 1.2V voltage regulator, the voltage VIN, which is otherwise 5V, itself becomes 1.2V, and this voltage is then transferred to the VOUT node via the resistance drop of a switched-on PMOS. So the MOS sizes typically need to be huge to have a low on resistance.

A conventional technique employed for a VLSI chip containing a voltage regulator is illustrated in FIG. 2. Also shown in the figure is the lumped pass transistor, the output transistor of the voltage regulator, along with a number of pads to satisfy electromigration rules. This arrangement may suffer from severe drawbacks such as electromigration problems due to poor power distribution, high IR drops, and difficulty in routing to the core.

Another conventional structure shows distributing the pads and fractions of the pass transistor over the periphery of the chip. If the pass transistor has four such pads, then the transistor can be split into four parts with each part occupying a side of the chip along with a pad. The scheme is shown in FIG. 3. This provides better power distribution and lower IR drops, but a potential problem in this structure is that each such I/O can occupy more area than a standard I/O in order to accommodate the huge-sized pass transistor. The problem may get worse in the bypass mode of the voltage regulators, where much larger sizes of the pass transistor are typically needed as there is no regulation in the bypass mode, and the on-resistance of the pass transistor typically needs to be reduced significantly. Thus, this structure has drawbacks in pad-limited designs.

U.S. Pat. No. 6,594,809 is a prior-art patent pertaining to area utilization within the core of a chip. It relates to low-leakage diode insertion for integrated circuits, particularly to inserting diodes in filler cells in the core of the integrated circuits. A drawback of this patent is that it does not provide a solution for utilization of area on the periphery of chip.

SUMMARY

Thus, a need has arisen for an area-efficient structure that utilizes the area on the periphery of the integrated circuit by ensuring that each I/O occupies the same area as a standard I/O and does not pose area problem to a pad-limited design.

An embodiment of the present disclosure is an area-efficient distributed device structure for integrated voltage regulators.

Another object of the present disclosure is a pass transistor that is distributed among a plurality of IOs around the periphery of the chip.

A further embodiment of the present disclosure minimizes electro migration problems in a chip and minimizes IR drops in the overall chip supplied by integrated voltage regulators.

Yet another embodiment of the present disclosure distributes the pass transistor so that each I/O occupies the same area as a standard I/O and does not pose a problem to a pad-limited design.

An embodiment of the present disclosure that provides an area-efficient distributed device structure for integrated voltage regulators at least one filler cell coupled between a pair of PADS on an I/O rail of a chip,
  at least one additional filler cell having a small-size portion of said device is coupled to said I/O rails for distributing replicas of said device on the periphery of said chip.

Further, an embodiment of the present disclosure is a method for creating a distributed device structure for integrated voltage regulators comprising steps of:

coupling at least one filler cell between a pair of PADS on I/O rail of a chip, incorporating portions of said device in additional filler cells, and connecting said additional filler cell to said I/O rails.

DETAILED DESCRIPTION

An embodiment of the disclosure is a distributed structure for a pass transistor such that each I/O occupies the same area as a standard I/O and does not pose any area problem to a pad-limited design. The remaining pass transistors can be accommodated in the area previously (in the prior art) occupied by the IOFILLERS (FIG. 4) by breaking it into small parts. These FILLER cells can be of multiple sizes (8×, 16×, 32×, 64×) and spread throughout the I/O ring on the periphery of the chip.

Figure 1:
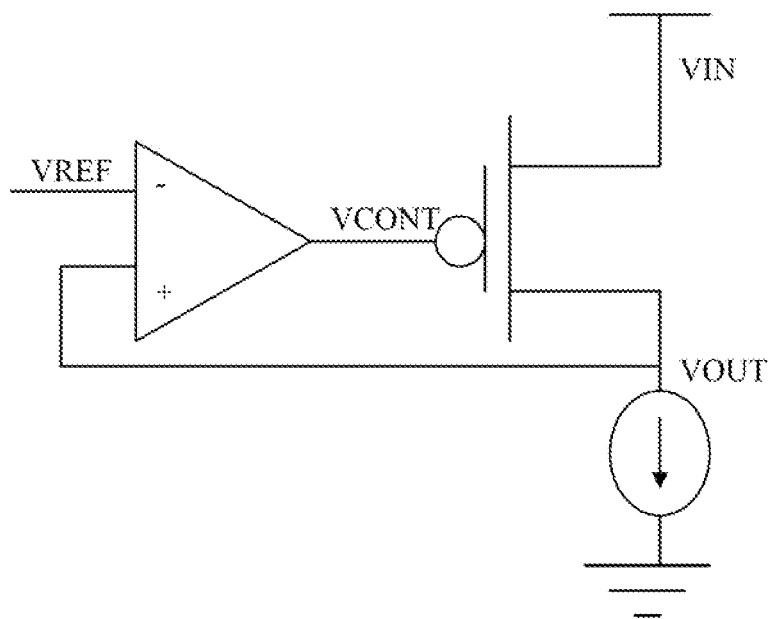
FIG. 1 illustrates a conventional voltage regulator.
Figure 2:
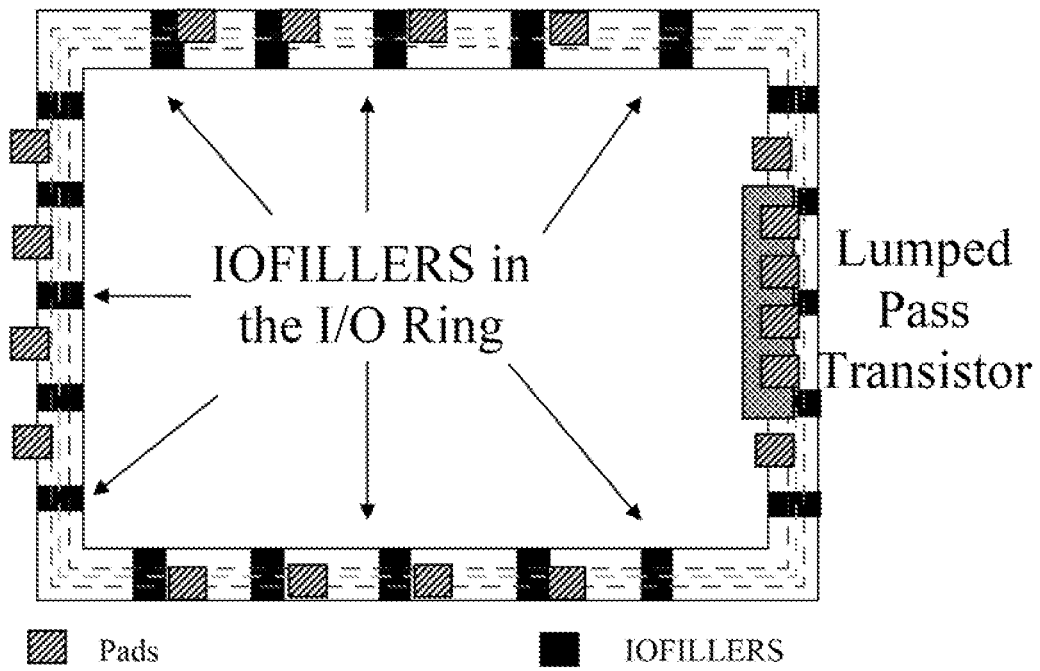
FIG. 2 illustrates a conventional technique of placing a pass element in a VLSI chip.
Figure 3:
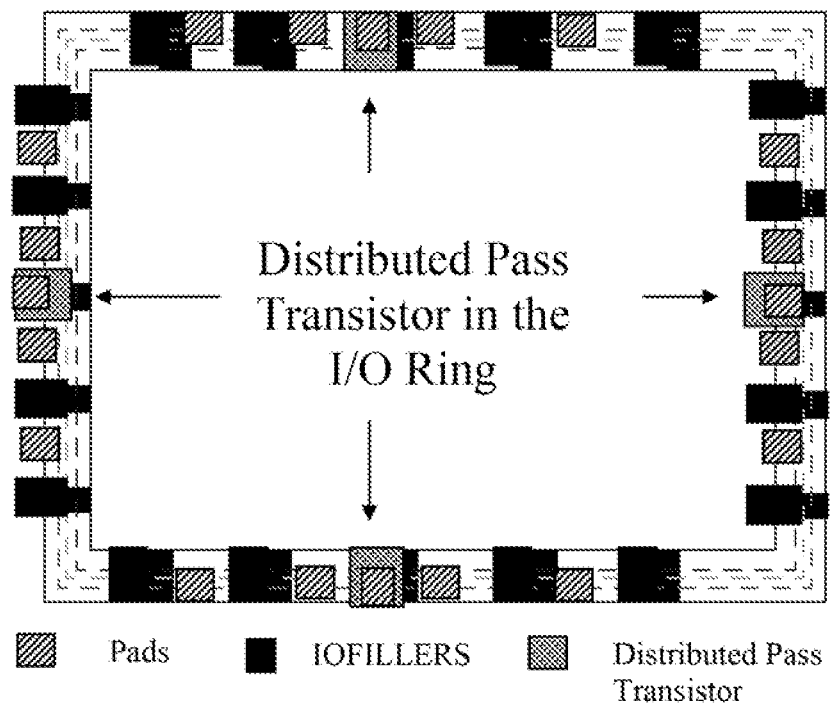
FIG. 3 shows another conventional technique for placing a pass element in a VLSI chip.
Figure 4:
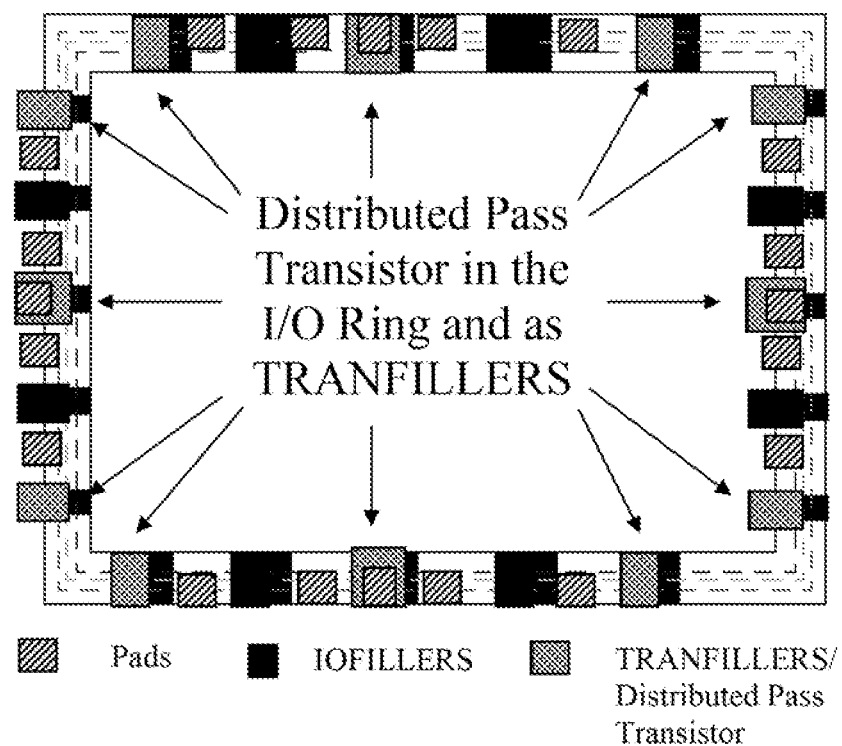
FIG. 4 illustrates an area-efficient distributed device structure for integrated voltage regulators in accordance with an embodiment of the disclosure.

Thus, it is possible to use the area occupied by the IOFILLERS to fabricate the pass transistor of a regulator. More specifically, the conventional IOFILLERS can be replaced by new TRANFILLER cells, each containing a small portion of the pass transistor below the I/O rails, besides the various metal layers. The lowest metal layers can be used for the routing purposes in the transistor. Such a structure for the distributed device is illustrated by FIG. 4. Just as there are many IOFILLERS present in a chip, similarly a plurality of TRANFILLERS can replace some or all of these IOFILLERS, depending upon the size of the pass transistor remaining to be placed after placing some of it along with its associated pads; wherein the TRANFILLERS are filler cells comprising the portions replicas of the device to be distributed. Just as IOFILLERS, the TRANFILLERS can also be made to be available in various sizes of 8×, 16×, 32×, 64×.

As discussed above, this embodiment of the disclosure is aimed at making a VLSI chip more area-efficient, and has the following advantages over the conventional structures of integrated voltage regulators.

Makes the chip less susceptible to electromigration. Particularly in circuits where the current-carrying capacity of the pass transistor under consideration is expected to be very high, electromigration may become a key factor. By distributing the transistor in the explained fashion, the required current finds several parallel paths instead of a single path as in the case of a lumped transistor. In this way, the fabricated product becomes less susceptible to failures due to current surges.

Reduces the possibility of large IR drops in the chip, which might be there due to the huge size of the chip. In other words, this embodiment improves the uniformity in the distribution of the power supplies.

In a pad-limited design, provides an area-efficient device distribution on the periphery of the chip. The pitch of the pads can be the minimum supported by the technology, even for the special I/Os containing the pass transistor, as the remaining portions of the transistor goes into the FILLERS.

Figure 5:
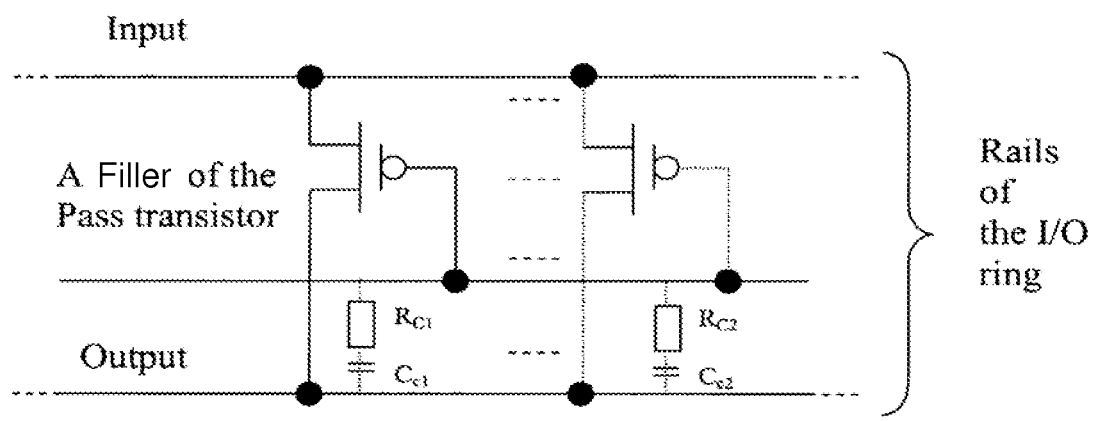
FIG. 5 illustrates a structure within a filler cell in accordance with an embodiment of the instant disclosure.
Figure 6:
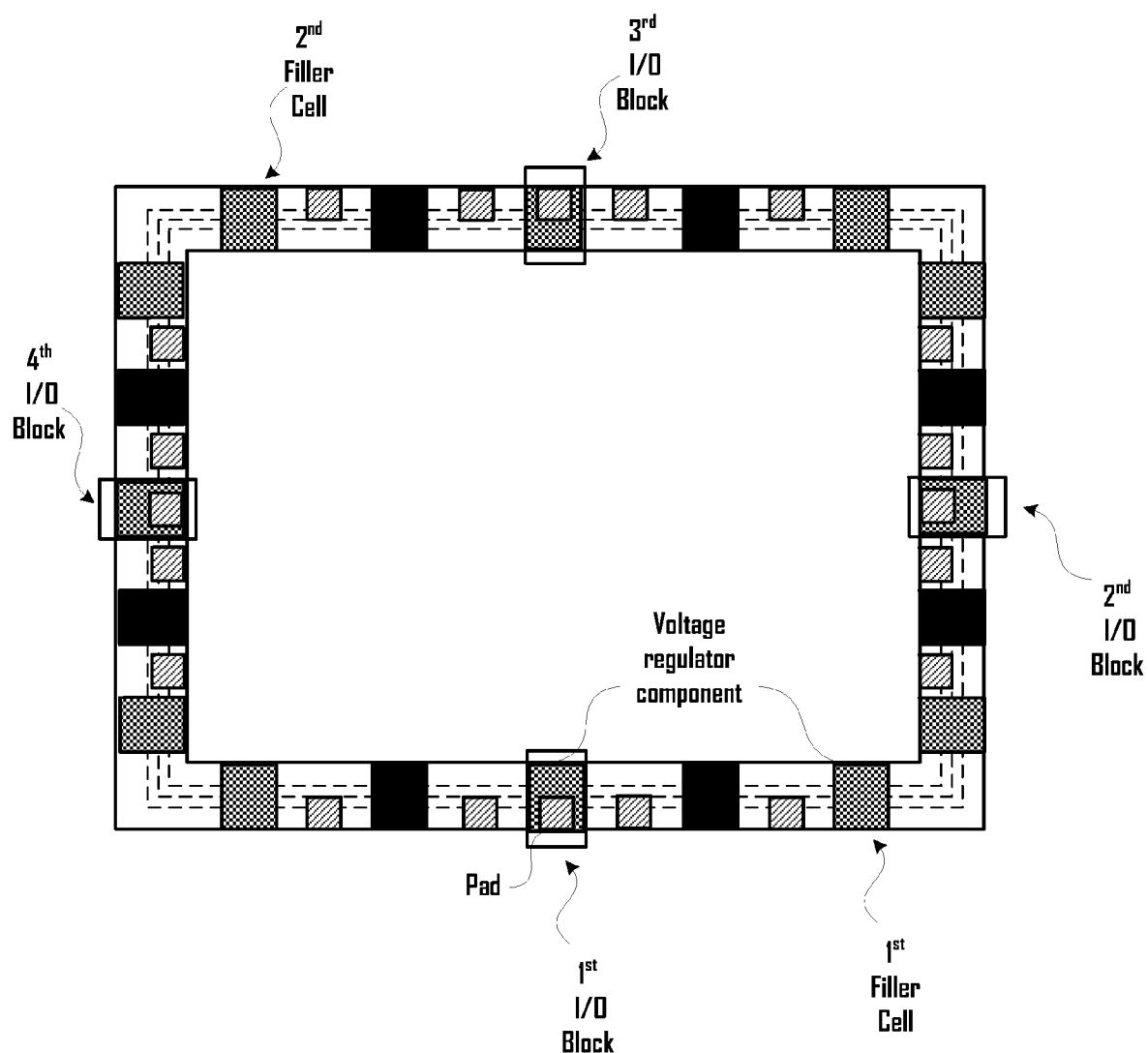
FIG. 6 illustrates an area-efficient distributed device structure for integrated voltage regulators in accordance with another embodiment of the disclosure.

Referring to FIG. 5, along with the pass transistor, other devices such as capacitances and resistances that might be required to compensate the regulator can also be placed in the TRANFILLERS, thereby making the structure more symmetrical and area-efficient. Alternatively, these other devices may be placed in other IOFILLERS, IOFILLER locations in which portions of a regulator pass transistor are not present.

An integrated circuit such as shown in FIGS. 4-5 may be part of an electronic system such as a computer system.

From the foregoing it will be appreciated that, although specific embodiments of the disclosure have been described herein for purposes of illustration, various modifications may be made without deviating from the spirit and scope of the disclosure.

What is claimed is:

1. A method for creating a distributed device structure for an integrated voltage regulator, comprising:
    disposing a component of said integrated voltage regulator in a chip, wherein said component comprises a plurality of smaller-size portions;
    disposing first and second input-output blocks in a periphery region;
    incorporating one smaller-size portion of said component in at least one of said input-output blocks;
    disposing at least one filler cell between said first and second input-output blocks in said periphery region,
    incorporating another smaller-size portion of said component in said at least one additional filler cell, and connecting said smaller-size portions to an input/output rail extending through the periphery region.

2. The method of claim 1, wherein disposing the component comprises disposing smaller-size portions of said component in a plurality of filler cells on the periphery for maximal area utilization.

3. A method of manufacturing an integrated circuit chip, comprising:
    disposing a rail around a periphery of an integrated circuit die;
    disposing blocks at the periphery, said blocks including a first type of blocks including a pad and a second type of blocks not including a pad; configuring the first type of blocks as input/output blocks; and configuring the second type of blocks as filler blocks;
    dividing a circuit element of a voltage regulator into a plurality of element portions; and
    including an element portion in at least one of said first type of blocks and in at least one of said second type of blocks, with at least one element portion coupled to said rail.

4. The method of claim 3, further comprising disposing an additional rail around the periphery of the integrated circuit die and wherein at least another element portion is coupled to said additional rail.

5. The method of claim 3, wherein the circuit element of the voltage regulator comprises a pass transistor and the element portions comprise portions of the pass transistor.

6. The method of claim 5, wherein at least one smaller size transistor is disposed in each second type block.

7. A method of manufacturing an integrated circuit, comprising:
    disposing first and second input-output blocks within a periphery;

disposing a first filler cell within the periphery between the first and second input-output blocks; and disposing a voltage regulator having a component disposed within the first input-output block and the first filler cell.

8. The method of claim 7, further comprising:

disposing an input-supply-voltage rail within the periphery; and disposing a regulated-output-voltage rail disposed within the periphery.

9. The method circuit of claim 7, further comprising configuring the component as a pass transistor.

10. The integrated circuit of claim 7, further comprising configuring the component as a capacitor.

11. The method of claim 7, further comprising:

disposing a third input-output block within the periphery; and disposing a second filler cell within the periphery between the first and third input-output blocks.

12. The method of claim 7, wherein the first and second input-output blocks have substantially a same size.

13. The method of claim 7, further comprising disposing a first pad within the periphery and over one of the first and second input-output blocks.

\* \* \* \* \*

UNITED STATES PATENT AND TRADEMARK OFFICE
CERTIFICATE OF CORRECTION

PATENT NO. : 9,018,046 B2  Page 1 of 1
APPLICATION NO. : 13/841099
DATED : April 28, 2015
INVENTOR(S) : Joshipura Jwalant et al.

It is certified that error appears in the above-identified patent and that said Letters Patent is hereby corrected as shown below:

In the Claims:

At column 5, claim number 8, line number 8, delete "disposed"

Signed and Sealed this
First Day of September, 2015

Michelle K. Lee
*Director of the United States Patent and Trademark Office*